United States Patent
Fujishima

(10) Patent No.: US 10,747,116 B2
(45) Date of Patent: Aug. 18, 2020

(54) PATTERN FORMING APPARATUS AND ARTICLE MANUFACTURING METHOD

(71) Applicant: CANON KABUSHIKI KAISHA, Tokyo (JP)

(72) Inventor: Hironobu Fujishima, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/292,953

(22) Filed: Mar. 5, 2019

(65) Prior Publication Data

US 2019/0278186 A1 Sep. 12, 2019

(30) Foreign Application Priority Data

Mar. 7, 2018 (JP) .................. 2018-041198

(51) Int. Cl.
- *G03B 27/42* (2006.01)
- *G03F 7/20* (2006.01)
- *G03F 9/00* (2006.01)

(52) U.S. Cl.
CPC ........ *G03F 7/70141* (2013.01); *G03F 9/7084* (2013.01); *G03F 9/7088* (2013.01)

(58) Field of Classification Search
CPC ......... H01L 2223/54426; H01L 23/544; H01L 21/0274; G03F 9/7088; G03F 7/70775; G03F 9/7003; G03F 7/0002; G03F 7/70141; G03F 7/70258; G03F 7/7085; G03F 9/7007; G03F 9/7015; G03F 9/7046; G03F 1/42; G03F 7/20; G03F 9/7042; G03F 9/7069

See application file for complete search history.

(56) References Cited

U.S. PATENT DOCUMENTS

| | | | | |
|---|---|---|---|---|
| 5,148,214 A | * | 9/1992 | Ohta | G03F 7/2002 355/43 |
| 2005/0140951 A1 | * | 6/2005 | Van Buel | G03F 7/70341 355/53 |
| 2009/0128792 A1 | | 5/2009 | Pellens | |
| 2009/0207399 A1 | | 8/2009 | Fong | |

FOREIGN PATENT DOCUMENTS

| | | |
|---|---|---|
| EP | 3258319 A2 | 12/2017 |
| JP | 2002-280299 A | 9/2002 |
| TW | 201138008 A | 11/2011 |
| TW | 201513171 A | 4/2015 |
| TW | 201727819 A | 8/2017 |
| TW | 201805739 A | 2/2018 |
| TW | 201839901 A | 11/2018 |

* cited by examiner

*Primary Examiner* — Mesfin T Asfaw

(74) *Attorney, Agent, or Firm* — Canon U.S.A., Inc. IP Division

(57) ABSTRACT

There is provided a pattern forming apparatus including a holding unit configured to suction and hold a substrate, and an optical system configured to detect, from a suction surface side of the substrate, an alignment mark formed on the substrate held by the holding unit. The pattern forming apparatus is provided with a wavelength separation element for performing wavelength separation between pattern forming light for forming a pattern on the substrate and alignment mark detection light for detecting the alignment mark.

23 Claims, 9 Drawing Sheets

PATTERN FORMING APPARATUS AND ARTICLE MANUFACTURING METHOD

BACKGROUND OF THE INVENTION

Field of the Invention

The present invention relates to a pattern forming apparatus and an article manufacturing method.

Description of the Related Art

Exposure apparatuses for projecting a mask pattern on a substrate through a projection optical system and transferring the pattern are used for manufacturing semiconductor devices and liquid crystal display elements by using a photolithography technique.

In these days, exposure apparatuses are being used to manufacture not only integrated circuit (IC) chips including memories and logics but also laminated devices produced using penetration via processes, such as a micro electromechanical system (MEMS) and a complementary metal oxide semiconductor (CMOS) image sensor.

An exposure apparatus performs an exposure process for exposing to light the front surface side of a substrate, such as a silicon wafer, based on alignment marks formed on the back surface side of the substrate (the surface side to be suctioned and fixed by a chuck). The exposure process is required to form a penetration via from the front surface side of the substrate to make an electrical connection with an electrical circuit on the back surface side of the substrate. For this reason, it is necessary to detect alignment marks formed on the back surface side of the substrate (hereinafter, referred to as "back surface alignment").

Japanese Patent Application Laid-Open No. 2002-280299 discusses a lithography apparatus including an optical system for alignment mark detection disposed on the back surface side of a substrate to perform the back surface alignment. Japanese Patent Application Laid-Open No. 2002-280299 discusses a technique for observing, by using the optical system for alignment mark detection disposed on the substrate stage, the alignment marks from the substrate stage side to detect mark images.

If an optical system for alignment mark detection is configured on a substrate stage as discussed in Japanese Patent Application Laid-Open No. 2002-280299, exposure light for exposing a substrate thereto may enter the optical system for alignment mark detection depending on the position of the detection field of the optical system for alignment mark detection.

When an optical member included in the optical system for alignment mark detection is irradiated with exposure light, the optical characteristic may change, for example, the color or transmissivity of the optical member may degrade. If the optical system for alignment mark detection changes in the optical characteristics, the time required for positioning control using alignment marks increases, possibly degrading the productivity in device manufacturing. In addition, the degradation of the alignment mark detection accuracy may cause the degraded positioning accuracy.

SUMMARY OF THE INVENTION

According to an aspect of the present invention, a pattern forming apparatus for forming a pattern on a substrate includes a holding unit configured to hold the substrate, and an optical system configured to detect an alignment mark formed on the substrate held by the holding unit, from a holding surface side of the substrate. The optical system includes a separation element for separating pattern forming light for forming a pattern on the substrate and alignment mark detection light for detecting the alignment mark.

According to another aspect of the present invention, an article manufacturing method includes positioning a held substrate by detecting, from a holding surface side of the substrate, an alignment mark formed on the held substrate, forming a pattern on the positioned substrate, and manufacturing an article by processing the substrate with the pattern formed thereon, wherein, in the positioning, the alignment mark is detected by using alignment mark detection light that has passed through a separation element for separating pattern forming light for forming a pattern on the substrate and alignment mark detection light for detecting the alignment mark.

Further features of the present invention will become apparent from the following description of exemplary embodiments with reference to the attached drawings. Each of the embodiments of the present invention described below can be implemented solely or as a combination of a plurality of the embodiments. Also, features from different embodiments can be combined where necessary or where the combination of elements or features from individual embodiments in a single embodiment is beneficial.

DESCRIPTION OF THE EMBODIMENTS

Exemplary embodiments of the present invention will be described below with reference to the accompanying drawings.

Figure 1:
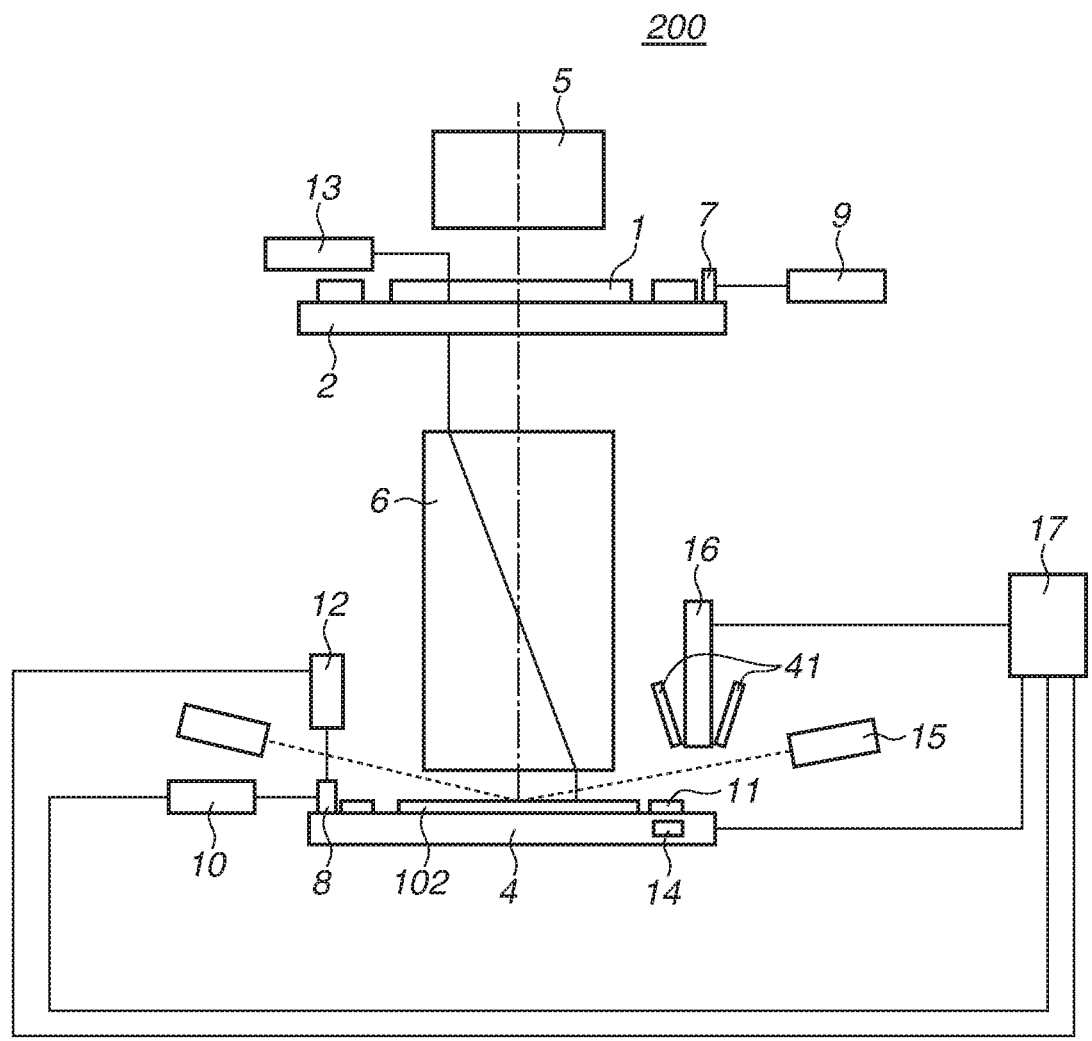
FIG. 1 is a diagram schematically illustrating an exposure apparatus.

FIG. 1 schematically illustrates a configuration of an exposure apparatus 200 according to an aspect of the present exemplary embodiment. The exposure apparatus 200 is an example of a lithography apparatus (pattern forming apparatus) for forming a pattern on a substrate. The exposure apparatus 200 includes a mask stage 2 for holding a mask (reticle) 1, a substrate stage 4 for holding a substrate 102, and an illumination optical system 5 for illuminating the mask 1 that is held on the mask stage 2. The exposure apparatus 200 also includes a projection optical system 6 for projecting an image of the pattern of the mask 1 on the substrate 102 held on the substrate stage 4, and a control unit (computer) 17 for performing overall control operations of the entire exposure apparatus 200.

The exposure apparatus 200 according to the present exemplary embodiment is a scanning exposure apparatus (scanner) that transfers the pattern of the mask 1 onto the substrate 102 while synchronously scanning the mask 1 and the substrate 102 in the scanning direction. However, the exposure apparatus 200 may be an exposure apparatus (stepper) that projects the pattern of the mask 1 onto the substrate 102, with the mask 1 fixed.

In the following descriptions, the direction (optical axis direction) that coincides with the optical axis of the projection optical system 6 refers to the Z-axis direction, the scanning direction of the mask 1 and the substrate 102 in a plane perpendicular to the Z-axis direction refers to the Y-axis direction, and the direction (non-scanning direction) perpendicular to the Y-axis and Z-axis directions refers to the X-axis direction. The rotational directions around the X-axis, Y-axis, and Z-axis refer to the θX, θY, and θZ directions, respectively.

The illumination optical system 5 illuminates the mask 1, more specifically, a predetermined illumination region on the mask 1, with light (exposure light) having a uniform illuminance distribution. Generally, near-ultraviolet light with a wavelength range from 100 to 400 nm is used as exposure light. Examples of usable exposure light include the g line (with a wavelength of about 436 nm) and the i line (with a wavelength of about 365 nm) of an ultra-high pressure mercury lamp, KrF excimer laser (with a wavelength of about 248 nm), ArF excimer laser (with a wavelength of about 143 nm), and F2 laser (with a wavelength of about 157 nm). Extreme ultraviolet (EUV) light with a wavelength of several nanometers to several hundreds of nanometers may be used as exposure light to manufacture more minute semiconductor devices. Hereinafter, exposure light is also referred to as pattern forming light.

The mask stage 2 can move two-dimensionally in a plane perpendicular to the optical axis of the projection optical system 6, i.e., in the XY plane, and can rotate in the θZ direction. The mask stage 2 is single-shaft driven or six-shaft driven by a driving device such as a linear motor (not illustrated).

A mirror 7 is disposed on the mask stage 2. A laser interferometer 9 is disposed at a position facing the mirror 7. The laser interferometer 9 measures the 2-dimensional position and rotational angle of the mask stage 2 in real time and outputs the measurement result to the control unit 17. The control unit 17 controls the driving device of the mask stage 2 based on the measurement result of the laser interferometer 9 to position the mask 1 held on the mask stage 2.

The projection optical system 6 including a plurality of optical elements projects the pattern of the mask 1 onto the substrate 102 with a predetermined projection magnification β. A photosensitive agent (resist) is applied on the substrate 102. When the image of the pattern of the mask 1 is projected onto the photosensitive agent, a latent image pattern is formed on the photosensitive agent. The projection optical system 6 according to the present exemplary embodiment is, for example, a reduction optical system having a projection magnification β of ¼ or ⅕.

The substrate stage 4 includes a Z stage for holding the substrate 102 via a chuck as a substrate holding apparatus for suctioning and holding the substrate 102, an XY stage for supporting the Z stage, and a base for supporting the XY stage. The substrate stage 4 is driven by a driving device such as a linear motor. The chuck for suctioning and holding the substrate 102 is detachably attached to the substrate stage 4.

A mirror 8 is disposed on the substrate stage 4. Laser interferometers 10 and 12 are disposed at positions facing the mirror 8. The laser interferometer 10 measures the X-axis, the Y-axis, and the θZ direction positions of the substrate stage 4 in real time and outputs the measurement result to the control unit 17. In a similar manner, the laser interferometer 12 measures the Z-axis, the θX, and the θY direction positions of the substrate stage 4 in real time and outputs the measurement result to the control unit 17. The control unit 17 controls the driving device for the substrate stage 4 based on the measurement results from the laser interferometers 10 and 12 to position the substrate 102 held on the substrate stage 4.

A mask alignment detection system 13 is disposed in the vicinity of the mask stage 2. The mask alignment detection system 13 detects a mask reference mark (not illustrated) on the mask 1 held on the mask stage 2, and a reference mark 39 on a stage reference plate 11 disposed on the substrate stage 4 via the projection optical system 6.

By using the same light source as the one to be used when the substrate 102 is actually exposed, the mask alignment detection system 13 illuminates the mask reference mark on the mask 1 and the reference mark 39 via the projection optical system 6. The mask alignment detection system 13 detects reflected light from the mask reference mark and the reference mark 39 by using an image sensor (e.g., a photoelectric transducer such as a charge coupled device (CCD) camera). Based on the detection signal from the image sensor, positioning (alignment) between the mask 1 and the substrate 102 is performed. In this case, the relative positional relationship (X, Y, Z) between the mask 1 and the substrate 102 can be aligned by aligning the position and focus of the mask reference mark on the mask 1 and the reference mark 39 on the stage reference plate 11.

A mask alignment detection system 14 is disposed on the substrate stage 4. The mask alignment detection system 14 as a transmission type detection system is used when the reference mark 39 is a transmission type mark. The mask alignment detection system 14 illuminates the mask reference mark on the mask 1 and the reference mark 39 by using the same light source as the one to be used when the substrate 102 is actually exposed and detects transmission light from the marks by using a light quantity sensor. In this case, the mask alignment detection system 14 detects the light quantity of the transmission light that has transmitted the reference mark while moving the substrate stage 4 in the X-axis (or Y-axis) and Z-axis directions. This makes it possible to align the position and focus of the mask reference mark on the mask 1 and the reference mark 39 on the stage reference plate 11. Using either the mask alignment detection system 13 or 14 in this way enables aligning the relative positional relationship (X, Y, Z) between the mask 1 and the substrate 102.

The stage reference plate 11 is disposed at a corner of the substrate stage 4 so that the front surface of the stage reference plate 11 is almost the same height as the front surface of the substrate 102. The stage reference plate 11 may be disposed at one corner of the substrate stage 4 or disposed at a plurality of corners of the substrate stage 4.

Figure 2:
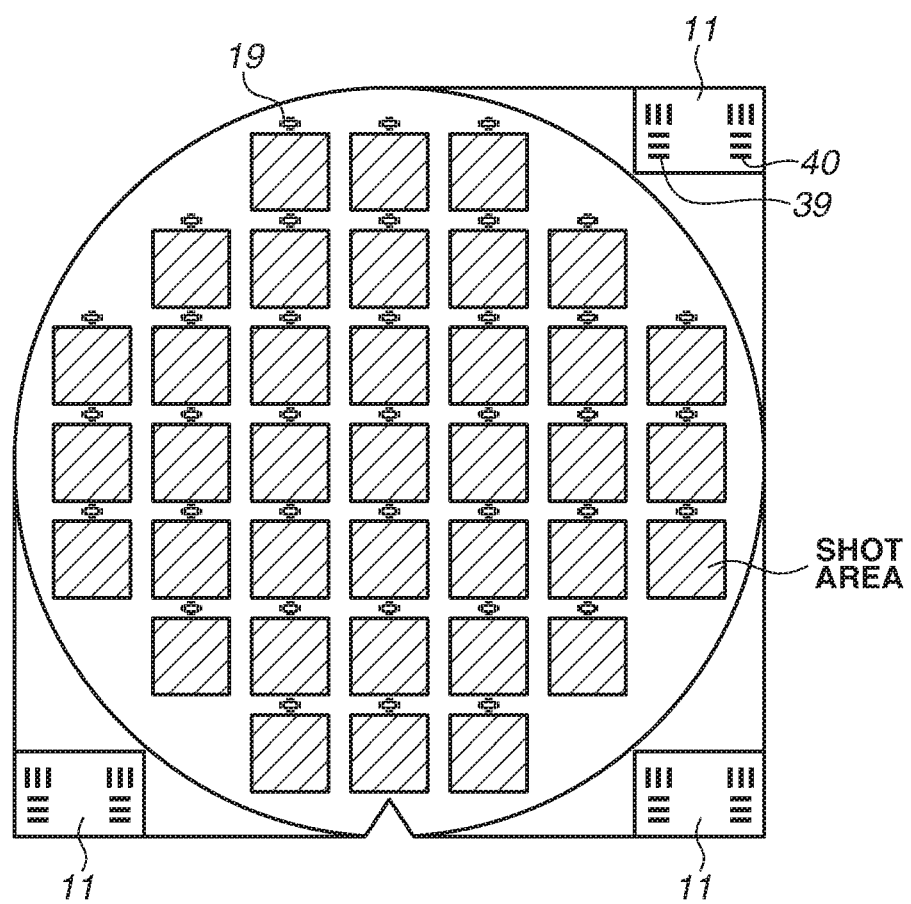
FIG. 2 is a plan view illustrating a substrate and a substrate stage.

As illustrated in FIG. 2, the stage reference plate 11 includes the reference mark 39 to be detected by the mask alignment detection system 13 or 14 and a reference mark 40 to be detected by the substrate alignment detection system 16. FIG. 2 is a plan view illustrating the wafer 3 and the substrate stage 4 when viewed from the Z-axis direction. The stage reference plate 11 may have a plurality of reference marks 39 and a plurality of reference marks 40. The positional relationship (in the X-axis and Y-axis directions) between the reference marks 39 and 40 is set to a predetermined (known) positional relationship. The reference marks 39 and 40 may be a common mark. As illustrated in FIG. 2, alignment marks are formed in scribe lines between shot areas on the wafer 3.

A focus detection system 15 includes a projection system for projecting light onto the front surface of the substrate 102 and a light reception system for receiving light reflected on the front surface of the substrate 102. The focus detection system 15 detects the Z-axis direction position of the substrate 102 and outputs the detection result to the control unit 17. The control unit 17 controls the driving device for driving the substrate stage 4 based on the detection result of the focus detection system 15 to adjust the Z-axis direction position and inclination angle of the substrate 102 held on the substrate stage 4.

The substrate alignment detection system 16 includes an optical system such as an illumination system for illuminating a mark and an imaging system for forming an image of the mark with light from the mark. The substrate alignment detection system 16 detects various marks, for example, alignment marks formed on the substrate 102 and the reference mark 40 on the stage reference plate 11 and outputs the detection result to the control unit 17. The control unit 17 controls the driving device for driving the substrate stage 4 based on the detection result of the substrate alignment detection system 16 to adjust the X-axis and Y-axis direction positions or the θZ direction rotational angle of the substrate 102 of the substrate stage 4 held on the substrate stage 4.

The substrate alignment detection system 16 includes a focus detection system (auto-focus (AF) detection system) 41 for the substrate alignment detection system 16. Like the focus detection system 15, the AF detection system 41 includes a projection system for projecting light onto the front surface of the substrate 102 and a light reception system for receiving light reflected on the front surface of the substrate 102. The focus detection system 15 is used for focusing the projection optical system 6 while the AF detection system 41 is used for focusing the substrate alignment detection system 16.

In general, the configuration of the detection system for detecting the mark on the side of the substrate 102 is roughly divided into two systems: an Off-axis Alignment (OA) detection system and a Through the Lens Alignment (TTL) detection system. The OA detection system optically detects the alignment mark formed on the substrate 102 without using the projection optical system. The TTL detection system detects the alignment mark formed on the substrate 102 by using light (non-exposure light) with a wavelength different from the wavelength of the exposure light via the projection optical system. While, in the present exemplary embodiment, the substrate alignment detection system 16 is an OA detection system, the alignment detection method is not limit thereto. For example, when the substrate alignment detection system 16 is a TTL detection system, the substrate alignment detection system 16 detects the alignment mark formed on the substrate 102 via the projection optical system 6. However, the basic configuration thereof is similar to that of the OA detection system.

Figure 3:
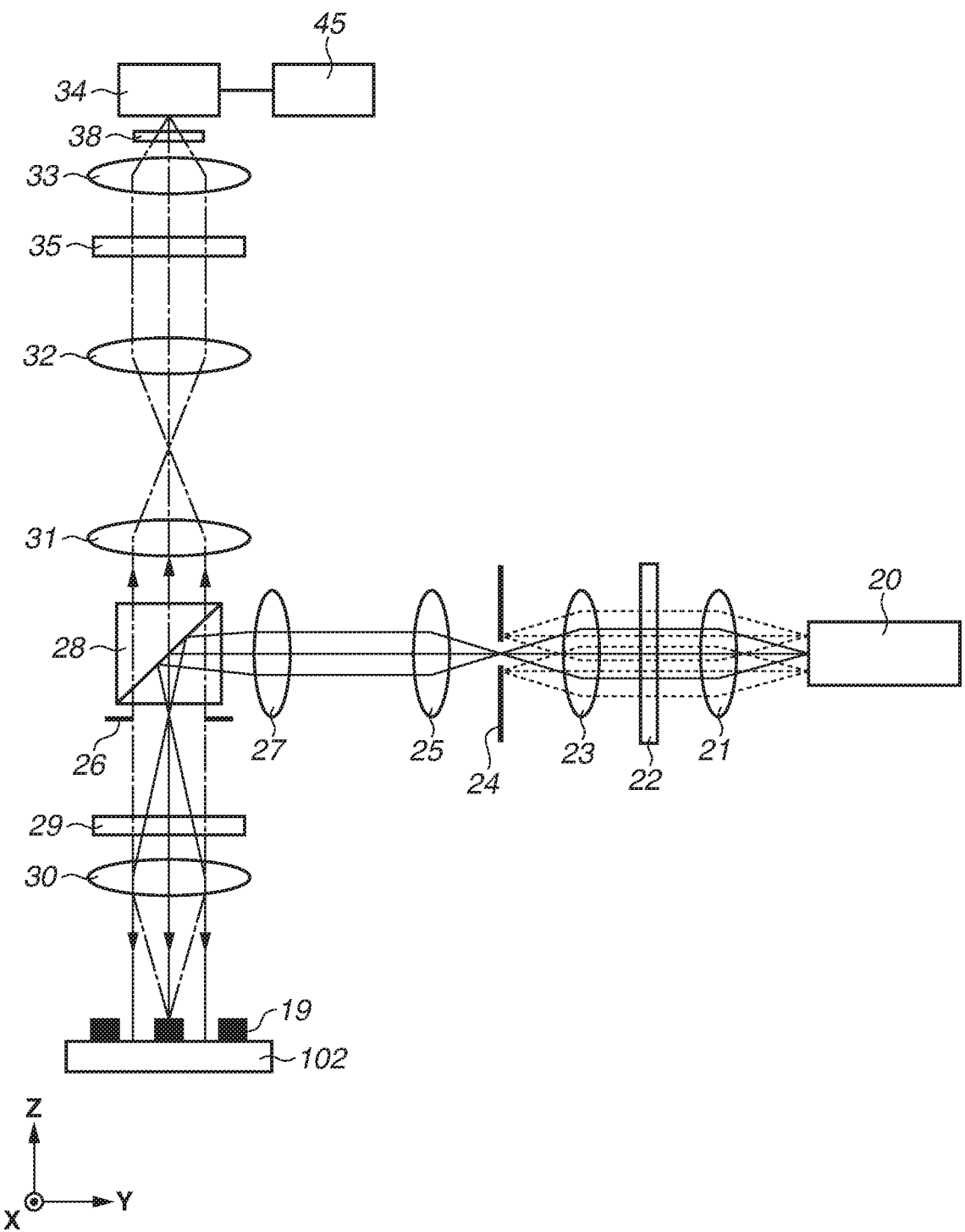
FIG. 3 is a diagram schematically illustrating a substrate alignment detection system.

The substrate alignment detection system 16 will be described in detail below with reference to FIG. 3. FIG. 3 is a diagram schematically illustrating a specific configuration of the substrate alignment detection system 16. The substrate alignment detection system 16 functions as a detection unit for detecting various marks. For example, the substrate alignment detection system 16 detects the alignment mark (first mark) formed on the front surface of the substrate 102 and also detects the alignment mark (second mark) formed on the back surface of the substrate 102. The back surface of the substrate 102 refers to the surface on the suction surface side of the substrate 102 to be suctioned and fixed by the chuck for suctioning and holding a substrate. The front surface of the substrate 102 refers to the surface opposite to the suction surface side of the substrate 102 and is the surface with a photosensitive agent for pattern forming being applied. The substrate alignment detection system 16 detects the reference mark formed on the chuck (described below). To simplify descriptions, FIG. 3 illustrates an example case where the substrate alignment detection system 16 detects an alignment mark (hereinafter referred to as a "front surface side mark") 19 formed on the front surface side of the substrate 102 illustrated in FIG. 2. The substrate 102 is assumed to be made of Si wafer.

A light source 20 emits visible light (e.g., light with a wavelength range of 400 to 800 nm) as light with a wavelength that does not transmit the substrate 102 and infrared light (e.g., light with a wavelength range of 800 to 1500 nm) as light with a wavelength that transmits the substrate 102. The light from the light source 20 passes through a first relay optical system 21, a wavelength filter plate 22, and a second relay optical system 23 and reaches an aperture diaphragm 24 positioned on the pupil plane (optical Fourier transform plane for the object surface) of the substrate alignment detection system 16.

A plurality of filters having different wavelength bands of light to be transmitted is disposed on the wavelength filter plate 22. Under the control of the control unit 17, one of the plurality of filters is selected and disposed on the optical path of the substrate alignment detection system 16. According to the present exemplary embodiment, a visible light filter for transmitting visible light and an infrared light filter for transmitting infrared light are disposed on the wavelength filter plate 22. When these two filters are switched therebetween, one of the filters illuminates the mark with visible light or infrared light. The wavelength filter plate 22 is configured to enable disposing additional filters.

As the aperture diaphragm 24, a plurality of aperture diaphragms having different illumination 6 values (aperture diameters) is disposed. Under the control of the control unit 17, the illumination 6 value of light for illuminating the mark can be changed by switching the aperture diaphragms disposed on the optical path of the substrate alignment detection system 16. The aperture diaphragm 24 is configured to enable disposing additional aperture diaphragms.

The light that has reached the aperture diaphragm 24 is led to a polarizing beam splitter 28 via a first illumination system 25 and a second illumination system 27. S-polarized light perpendicular to the sheet surface of FIG. 3 out of the light led to the polarizing beam splitter 28 is reflected by the polarizing beam splitter 28, and transmits the numerical aperture (NA) diaphragm 26 and a λ/4 plate 29 to be converted into circularly polarized light. The light that transmits the λ/4 plate 29 passes through an object lens 30 and illuminates the front surface side marks 19 formed on the substrate 102. The NA diaphragm 26 can change NA by changing the aperture amount under the control of the control unit 17.

Reflected light, diffraction light, and scattered light from the front surface side mark 19 pass through the object lens 30, transmit the λ/4 plate 29 to be converted into P-polarized light parallel to the paper surface of FIG. 3, and transmit the polarizing beam splitter 28 via the NA diaphragm 26. The light that transmits the polarizing beam splitter 28 forms an image of the front surface side mark 19 on a photoelectric transducer (such as a charge coupled device (CCD) sensor) 34 via a relay lens 31, a first imaging system 32, a coma aberration adjustment optical member 35, and a second imaging system 33. The photoelectric transducer 34 captures (detects) an image of the front surface side mark 19 and acquires a detection signal. When the image of the alignment mark formed on the back surface of the substrate 102 is formed on the photoelectric transducer 34, the photoelectric transducer 34 captures the image of the alignment mark and acquires a detection signal.

When the substrate alignment detection system 16 detects the front surface side mark 19 formed on the substrate 102, a resist (transparent layer) is applied (formed) on the front surface side mark 19. Accordingly, an interference fringe is generated when monochromatic light or light with a narrow wavelength band is used. In this case, an interference fringe signal is added to the detection signal from the photoelectric transducer 34, making it impossible to detect the front surface side mark 19 with high accuracy. Generally, the possibility that the interference fringe signal is added to the detection signal from the photoelectric transducer 34 is reduced by using a light source for emitting light with a wide bandwidth wavelength as the light source 20.

A processing unit 45 performs processing for obtaining the position of a mark based on the mark image captured by the photoelectric transducer 34. However, the control unit 17 or an external control apparatus may include the function of the processing unit 45.

As a method for detecting an alignment mark on the substrate 102, the mark is detected by illuminating it from the front surface side of the substrate 102. A configuration for detecting a mark by illuminating it from the back surface side of the substrate will be described below.

Figure 4:
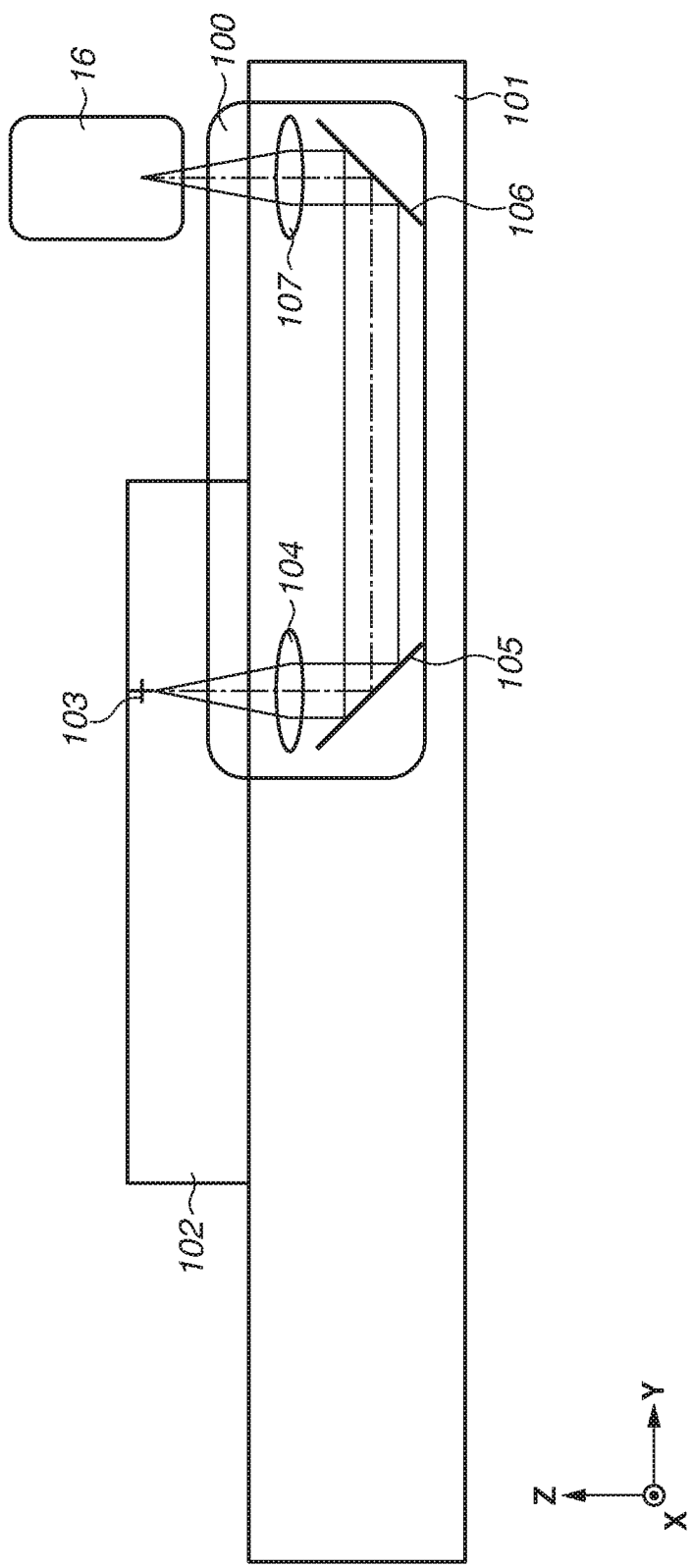
FIG. 4 is a diagram illustrating a configuration of an optical system.

FIG. 4 illustrates an optical system 100 for detecting an alignment mark 103 from the side of a chuck 101. FIG. 4 is a cross-sectional view illustrating a configuration including the optical system 100. The optical system 100 is positionally fixed inside the chuck 101 (holding member) for suctioning and holding the substrate 102 and is integrally formed with the chuck 101. The alignment mark 103 is formed on the back surface of the substrate 102 or formed between the front and the back surfaces of the substrate 102.

The optical system 100 includes lenses 104 and 107, mirrors 105 and 106, and a lens barrel for transmitting or reflecting illumination light (hereinafter referred to as alignment mark detection light) from the substrate alignment detection system 16. The optical system 100 is a relay (image forming) optical system for illuminating the alignment mark 103 on the substrate 102 by using the alignment mark detection light to form an image of the alignment mark 103 on the image plane at a position separated from the substrate 102.

The substrate alignment detection system 16 detects the image of the alignment mark 103 formed on the image plane and obtains the position of the alignment mark 103. The Z-axis direction height of the image plane can be arbitrarily changed in design. Therefore, the range of the height of the image plane varying with the thickness of the substrate 102 and the mark position can be set to fall within the Z-axis direction driving range of the substrate stage 4.

Thermal deformation of the chuck 101 is restrained and the weight is reduced by disposing the light source of the alignment mark detection light and the photoelectric transducer in the substrate alignment detection system 16, and configuring the relay optical systems in the optical system 100. It is desirable that the wavelength of the alignment mark detection light is the wavelength of near-infrared light, 800 nm or more and 1500 nm or less. Light with a wavelength in this wavelength range transmits silicon.

The position of the image plane changes with changing position of the alignment mark 103 on the substrate 102, i.e., changing distance from the suction surface of the substrate 102 by the chuck 101 to the alignment mark 103. Therefore, the substrate stage 4 is moved in the Z-axis direction so that the image plane falls within the focal depth detectable by the substrate alignment detection system 16 depending on the distance from the suction surface to the alignment mark 103.

According to the present exemplary embodiment of the present invention, the detection (observation) field with the optical system 100 is about φ1 mm and the magnification of the optical system 100 is 1 in consideration of the mark position measurement accuracy and the size of the optical system. The position measurement accuracy is about 500 nm. For example, if the optical system 100 is a magnification reduction system, the observation field is enlarged, but the measurement accuracy degrades. Although further increasing the lens diameter of the optical system 100 enlarges the observation field, the space in the chuck 101 is restricted.

Figure 5:
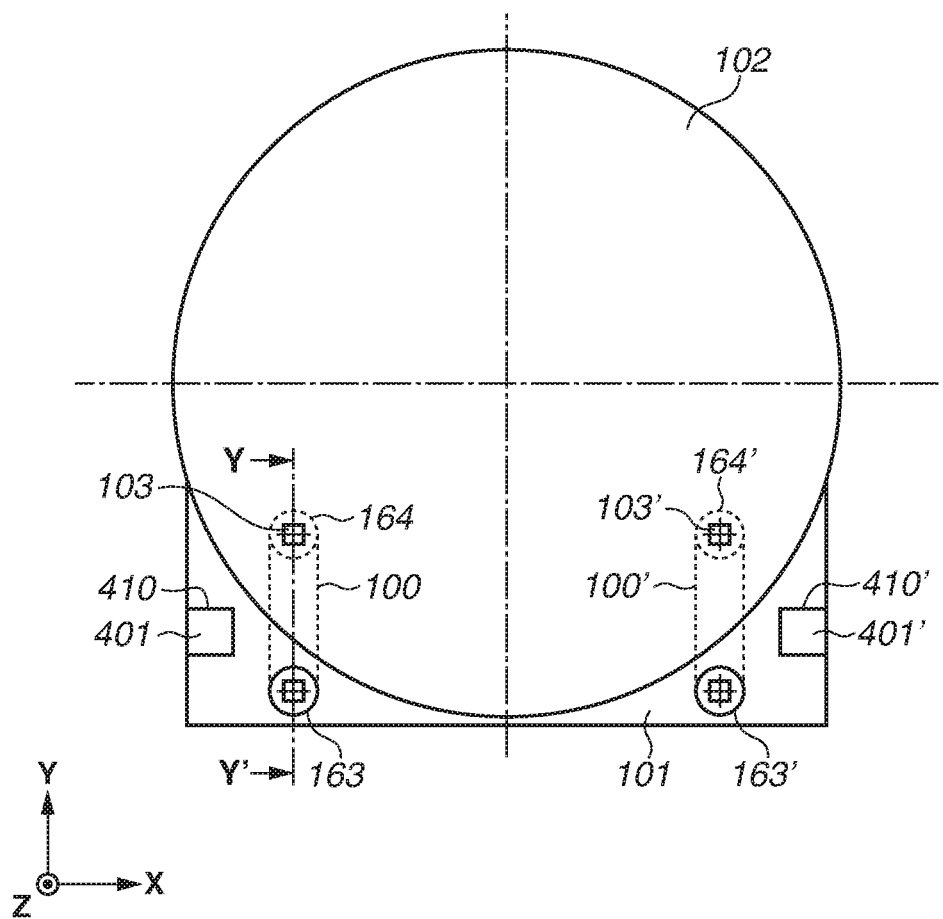
FIG. 5 is a diagram illustrating a layout relationship between the substrate and a chuck.

FIG. 5 is a top plan view illustrating the chuck 101 viewed from the Z-axis direction. FIG. 5 illustrates a state where the chuck 101 is suctioning the substrate 102. In addition to the optical system 100 indicated with dotted lines, the chuck 101 is provided with an optical system 100' at a position shifted from the optical system 100 in the X-axis direction. The optical system 100' has a similar configuration to the optical system 100.

FIG. 4 is a cross-sectional view illustrating the optical system 100 taken along the line Y-Y' illustrated in FIG. 5. The optical system 100 illuminates the alignment mark 103 within the observation field (detection field) 164 thereof to form an image of the alignment mark 103 on an image plane 163. The substrate 102 is provided with an alignment mark 103' at a position shifted from the alignment mark 103 in the X-axis direction, in addition to the alignment mark 103. The optical system 100' illuminates the alignment mark 103' within the observation field 164' to form an image of the alignment mark 103' on an image plane 163'. This makes it possible to measure the X-axis and Y-axis direction positions of the substrate 102 and the rotational angle (rotational position) θ around the Z axis with respect to the center position of the substrate 102 by using the optical systems 100 and 100'.

The observation fields 164 and 164' of the optical systems 100 and 100' are disposed to be identical in the Y-axis direction position when the chuck 101 is disposed on the substrate stage 4 without shifting. Since the configurations (light path lengths) of the optical systems 100 and 100' are identical, the image planes 163 and 163' are also disposed to be identical in the Y-axis direction position when the chuck 101 is disposed on the substrate stage 4 without shifting.

The chuck 101 is detachably attached to the substrate stage 4. The chuck 101 is replaced with another chuck depending on the substrate to be suctioned and fixed or for the purpose of maintenance. The image height (X-axis and Y-axis direction positions) of the observation field of the optical system 100 is fixed with respect to the chuck 101. Accordingly, when the shot layout of the substrate 102 to be suctioned and fixed by the chuck 101 or the position of the alignment mark 103 is changed, the optical system 100 may be unable to detect the alignment mark.

In this case, the chuck 101 is removed and replaced with a new chuck having a different position of the observation field of the optical system 100. More specifically, the chuck 101 is replaced depending on the shot layout of the substrate 102 to be suctioned and fixed by the chuck 101 or the position of the alignment mark 103, and the image height of the observation field of the optical system 100 is changed. If the optical system 100 is soiled or damaged, the entire chuck 101 with the optical system 100 disposed thereon can be easily replaced.

The exposure apparatus 200 has a chuck replacement mechanism (not illustrated) for carrying in or carrying out the chuck 101. When the chuck 101 is carried out, the suction force of the chuck 101 vacuum-suctioned and fixed on the substrate stage 4 is turned OFF. Then, the chuck 101 is raised and moved from the substrate stage 4 by the chuck replacement mechanism. When the chuck 101 is carried in, the chuck 101 is moved onto the substrate stage 4 by the chuck replacement mechanism. Then, a plurality of positioning pins protruding from the substrate stage 4 are inserted into the positioning holes on the chuck 101 to perform positioning. Then, the suction force of the chuck 101 is turned ON to fix the chuck 101 onto the substrate stage 4.

In this case, by enlarging the positioning holes on the chuck 101 with respect to the positioning pins on the substrate stage 4 to make spaces between the positioning holes and the positioning pins, the positioning pins can be easily fit into the positioning holes on the chuck 101. However, excessively large spaces increase a chuck positioning error on the substrate stage 4. For example, the chuck 101 largely rotates by an angle θ, thereby shifting the observation field of the optical system 100 from a predetermined position. Once the observation field of the optical system 100 shifts from the predetermined position, the alignment mark 103 of the substrate 102 may be unable to be detected when the substrate 102 is disposed at the predetermined position on the chuck 101.

According to the present exemplary embodiment, as illustrated in FIG. 5, reference marks 401 and 401' for measuring the position of the detection field of the optical system 100 are fixed at predetermined positions on the chuck 101. The reference mark 401 is formed on a mark plate 410 fixed on the chuck 101. The reference mark 401' is formed on a mark plate 410' fixed on the chuck 101. To measure the X-axis and the Y-axis direction positions, the reference marks 401 and 401' having two-dimensional features are desirable. Examples of desirable marks include a crisscross inside a square shape, a crisscross shape, and other marks having certain lengths in the X and Y directions.

To calculate the rotational angle θ of the chuck 101 with higher accuracy, the reference marks 401 and 401' are desirably formed at positions away from the center position (intersection of the dashed-dotted lines illustrated in FIG. 5) of the chuck 101 (substrate arrangement region) as much as possible. In the example illustrated in FIG. 5, the reference marks 401 and 401' are formed in the vicinity of the outermost edges of the chuck 101 in the X-axis direction. The reference marks 401 and 401' may be formed in such a manner that the Y-axis direction positions become identical when the chuck 101 is disposed on the substrate stage 4 without shifting.

Problems of the present invention will be described in detail below. As illustrated in FIG. 5, since the image plane 163 of the alignment mark 103 is generally set in the vicinity of an edge of the substrate 102, the exposure light is likely to enter the optical system 100 when a pattern is formed in the peripheral region of the substrate 102. The image plane 163 of the alignment mark 103 may be possibly set at a large distance from the edge of the substrate 102. In this case, the optical system 100 will increase in size.

The increase in size of the optical system 100 causes an increase in size of the chuck 101 for holding the substrate 102 and the substrate stage 4. Therefore, it is desirable that the optical system 100 is as small as possible.

A problem, which may arise when the exposure light enters the optical system 100, will be described. As the exposure light, the i line (with a wavelength of about 365 nm), KrF excimer laser (with a wavelength of about 248 nm), and ArF excimer laser (with a wavelength of about 143 nm) are used. When light with such a wavelength range enters the optical system 100, there may arise solarization or transmissivity degradation of lenses, a prism, and other optical members included in the optical system 100.

If the optical system 100 for alignment mark detection changes in the optical characteristics, the time required for positioning control using alignment marks increases, possibly degrading the productivity in device manufacturing. In addition, the degraded alignment mark detection accuracy may cause the degraded positioning accuracy.

According to the present disclosure, to remarkably reduce the light quantity of the exposure light entering optical members, included in the optical system 100, which may change in the optical characteristics, the optical system 100 is provided with a wavelength separation element for performing wavelength separation between the exposure light and the alignment mark detection light. A lens material having a high refractive index is generally known to be likely to change in the optical characteristics, such as solarization. Meanwhile, to restrain the size of the optical system 100, it is desirable to use optical members using a lens material having a high refractive index.

In general, a lens material having a refractive index of 1.80 or more to light with a wavelength of 400 nm has low resistance to near-ultraviolet light serving as the exposure light, and is likely to change in the optical characteristics, such as solarization. According to the following exemplary embodiments, a wavelength separation element such as a dichroic prism is disposed in the optical system 100 to protect, from the exposure light, optical members using a lens material having a refractive index of 1.80 or more to light with a wavelength of 400 nm.

As described above, according to the present disclosure, optical members using a lens material having a high refractive index are used to restrain the size of the optical system 100. Meanwhile, the optical system 100 is provided with a wavelength separation element for reducing the irradiation amount of the exposure light to optical members using a lens material having a high refractive index. The configuration of each exemplary embodiment of the present invention will be described in detail below.

Figure 6:
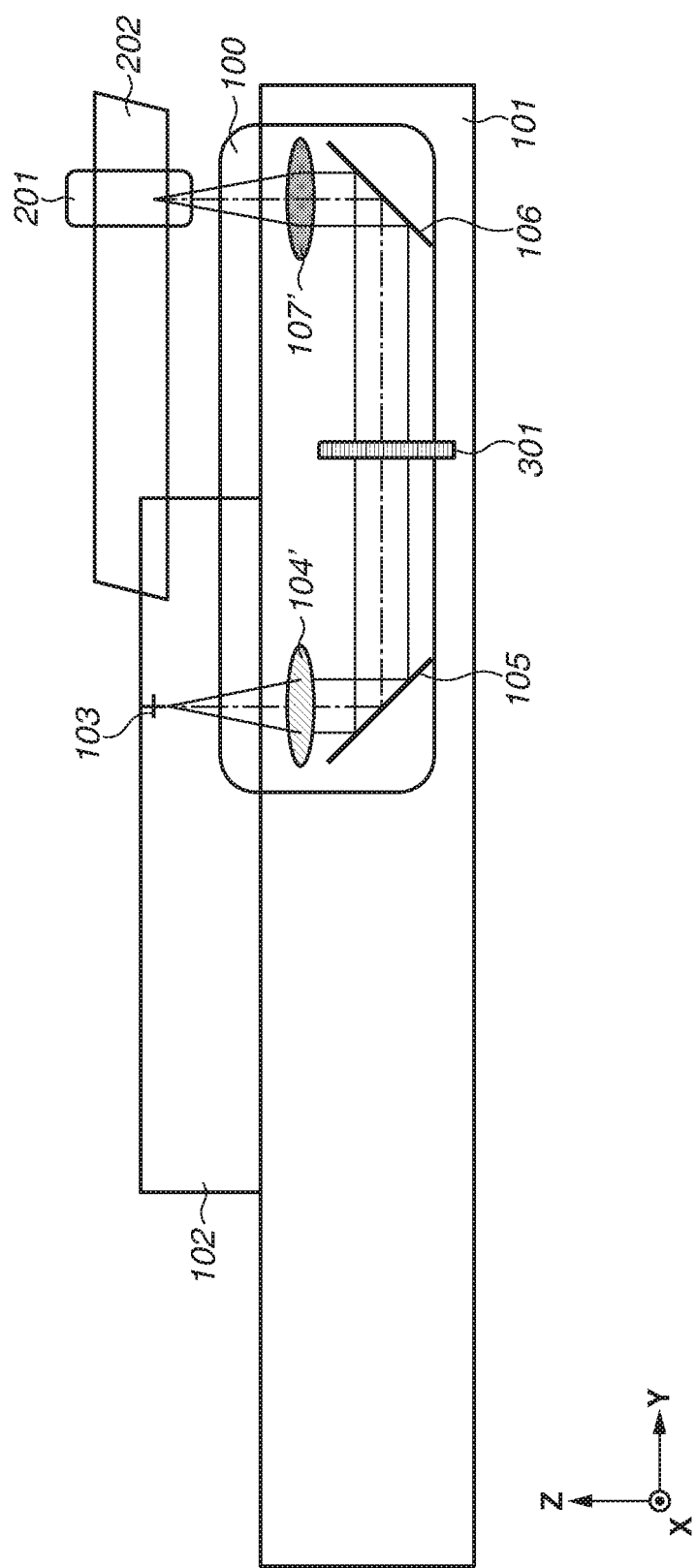
FIG. 6 is a diagram illustrating a configuration of an optical system according to a first exemplary embodiment.

FIG. 6 is a diagram illustrating a configuration of an optical system 100 according to a first exemplary embodiment. Members identical to those illustrated in FIG. 4 are assigned the same reference numerals. FIG. 6 illustrates a relationship between an irradiated region 202 of the exposure light and an irradiated region 201 of the alignment mark detection light when a pattern in the peripheral region of the substrate 102 is formed. The fact that the irradiated region 202 of the exposure light overlaps with the irradiated region 201 of the alignment mark detection light indicates that the exposure light may enter the optical system 100.

According to the first exemplary embodiment, a dichroic film (wavelength separation film) as a wavelength separation element having an optical characteristic of absorbing or reflecting the exposure light and transmitting the alignment mark detection light is deposited onto the lens 107'. This makes it possible to remarkably reduce the light quantity of the exposure light entering the lens 107'. Such a configuration is effective particularly when the lens 107' is configured by using a lens material having a refractive index of 1.80 or more to light with a wavelength of 400 nm as a material likely to change in the optical characteristics, such as solarization.

Employing the configuration according to the present exemplary embodiment enables remarkably reducing the amount of incidence of the exposure light to optical elements other than the lens 107'. Although the effect of the present invention can be acquired by depositing a dichroic film onto at least a part of region of the lens 107', it is desirable to provide a dichroic film over the entire surface of the lens 107'.

According to the first exemplary embodiment, a dichroic film is provided on a lens 104' in consideration of a case where the chuck 101 is irradiated with the exposure light in a state where the substrate 102 is not disposed. The dichroic film has an optical characteristic of absorbing or reflecting the exposure light and transmitting the alignment mark detection light. This makes it possible to protect optical members such as a lens disposed between the lenses 104' and 107' from the exposure light.

In addition to the method of depositing a dichroic film onto the lenses, it is also possible to dispose a dichroic filter (wavelength separation filter) having an optical characteristic of absorbing or reflecting the exposure light and transmitting the alignment mark detection light, in the optical path of the optical system 100. In addition, the wavelength separation effect can be improved by disposing a plurality of lenses with a deposited dichroic film.

If the exposure light has polarization characteristics, disposing a polarizing plate and a polarizing filter 301 in the optical path of the optical system 100 enables remarkably reducing the irradiation amount of the exposure light entering optical members that may change in the optical characteristics. If the exposure light does not have polarization characteristics, the polarizing filter 301 does not need to be disposed.

Figure 7:
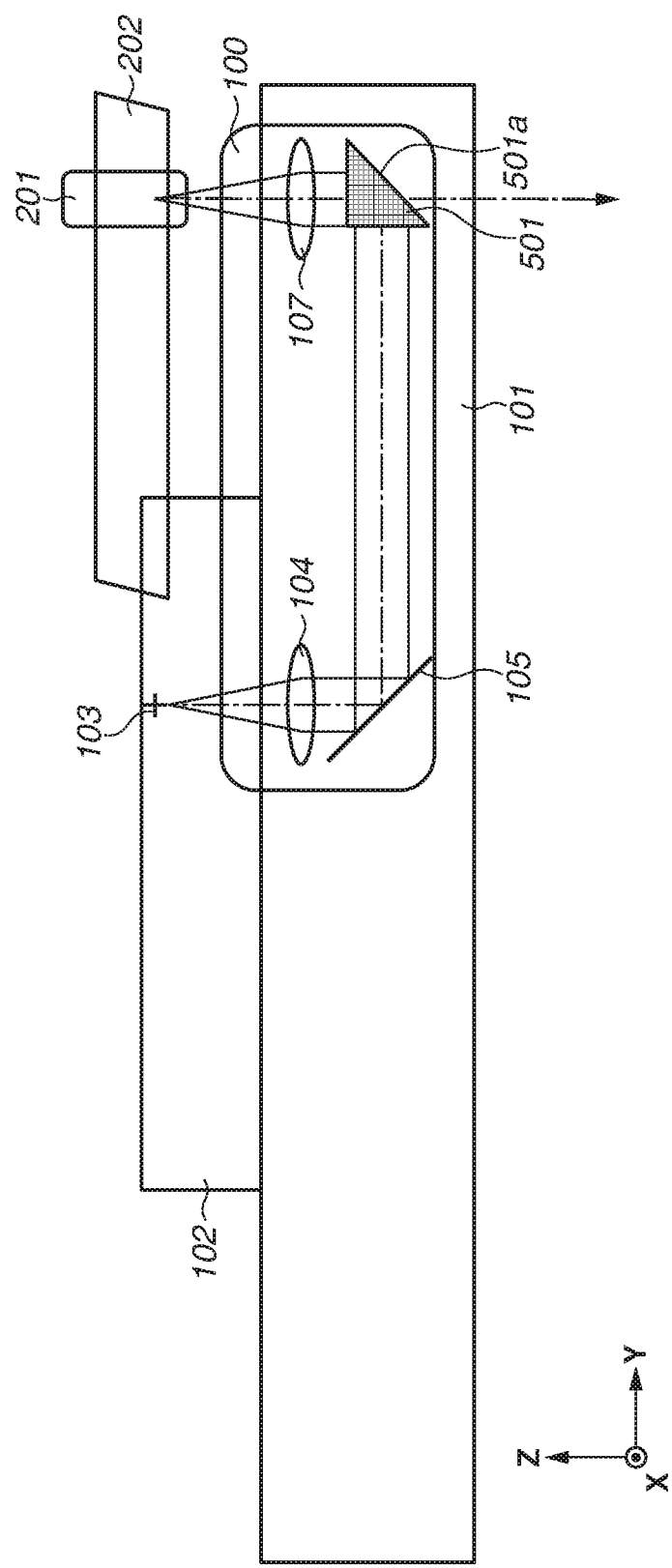
FIG. 7 is a diagram illustrating a configuration of an optical system according to a second exemplary embodiment.

FIG. 7 is a diagram illustrating a configuration of an optical system 100 according to a second exemplary embodiment. Members identical to those illustrated in FIG. 6 are assigned the same reference numerals.

In the optical system 100 according to the second exemplary embodiment, the reflective mirror 106 of the optical system 100 according to the first exemplary embodiment is replaced with a dichroic prism 501 for transmitting the exposure light and reflecting the alignment mark detection light. A surface 501a of the dichroic prism 501 transmits the exposure light and reflects the alignment mark detection light. This makes it possible to remarkably reduce the irradiation amount of the exposure light entering the optical members disposed in the optical path ranging from the dichroic prism 501 to the alignment mark 103.

Figure 8:
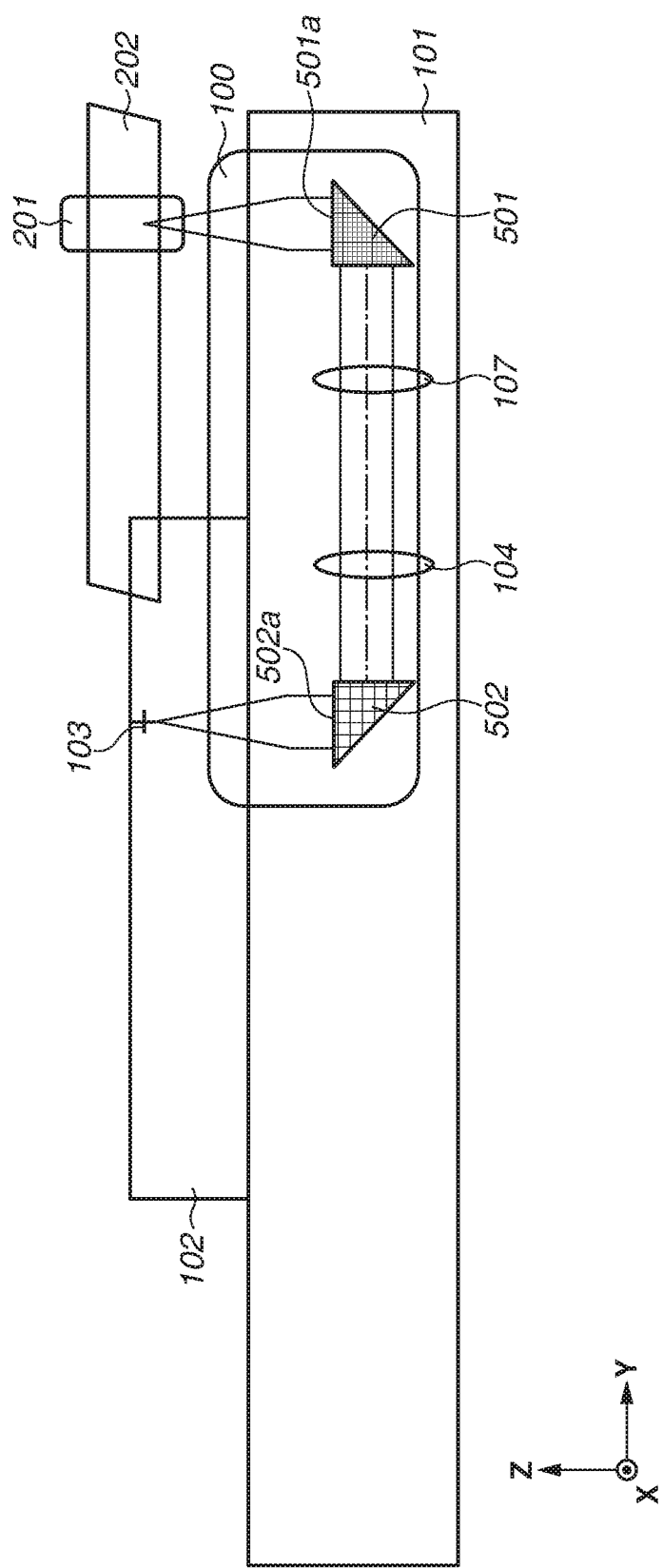
FIG. 8 is a diagram illustrating a configuration of an optical system according to a third exemplary embodiment.

FIG. 8 is a diagram illustrating a configuration of an optical system 100 according to a third exemplary embodiment. Members identical to those illustrated in FIG. 6 are assigned the same reference numerals.

The optical system 100 according to the third exemplary embodiment includes prisms 501 and 502 provided with an optical film having an optical characteristic of absorbing or reflecting the exposure light and transmitting the alignment mark detection light. The prism 501 is provided with an optical film 501a. When the exposure light is absorbed or reflected by the optical film 501a, the amount of incidence of the exposure light to the prism 501 can be reduced. Such a configuration is effective particularly when the prism 501 is configured by using a lens material having a refractive index of 1.80 or more to light with a wavelength of 400 nm as a material likely to change in the optical characteristics, such as solarization.

The prism 502 is provided with an optical film 502a. When the exposure light is absorbed or reflected by the optical film 502a, the amount of incidence of the exposure light to the prism 502 can be reduced. When the exposure light irradiation is performed in a state where the substrate 102 is not disposed on the chuck 101, the exposure light may enter the prism 502. Even in such a case, providing the optical film 502a enables reducing the amount of incidence of the exposure light to the prism 502.

Figure 9:
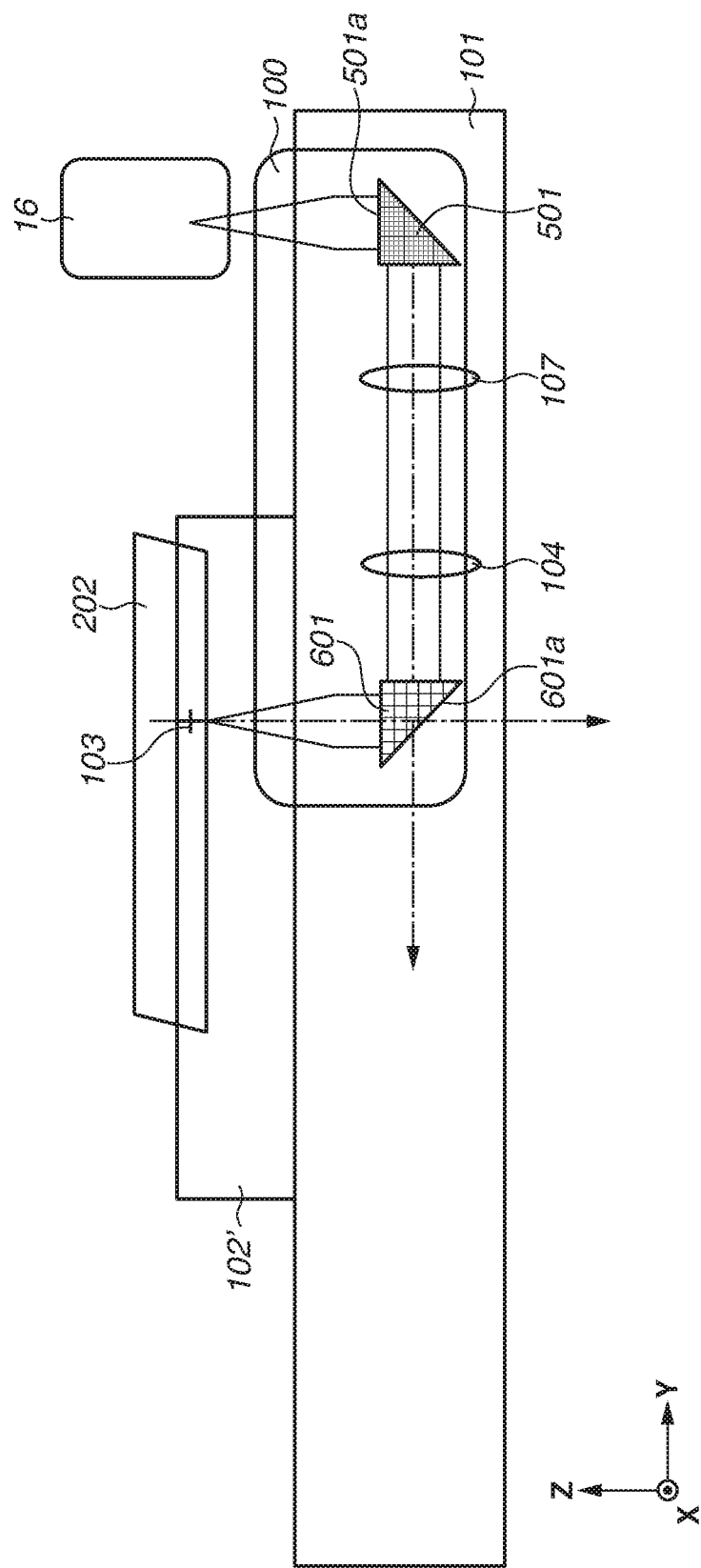
FIG. 9 is a diagram illustrating a configuration of an optical system according to a fourth exemplary embodiment.

FIG. 9 is a diagram illustrating a configuration of an optical system 100 according to a fourth exemplary embodiment. Members identical to those illustrated in FIG. 8 are assigned the same reference numerals. According to the fourth exemplary embodiment, the prism 502 according to the third exemplary embodiment is replaced with a dichroic prism 601. FIG. 9 illustrates the irradiated region 202 of the exposure light when a pattern is formed in the central region of a substrate 102'. The alignment mark 103 is positioned in the irradiated region 202 of the exposure light.

According to the present exemplary embodiment, it is assumed that the substrate 102' is made of a material that transmits the exposure light, such as glass. In this case, a large amount of incidence of the exposure light that transmits the substrate 102' to the optical system 100. According to the present exemplary embodiment, there is disposed the dichroic prism 601 that reflects the alignment mark detection light and transmits the exposure light that has penetrated the substrate 102'. A surface 601a reflects the alignment mark detection light and transmits the exposure light.

The dichroic prism 601 transmits the exposure light that has penetrated the substrate 102'. This enables reducing the risk that the exposure light that has penetrated the substrate 102' is reflected by the optical members included in the optical system 100 to expose the resist on the substrate 102' to light.

<Other Modifications>

The substrate is not limited to the substrate 102. The alignment mark 103 may be formed on the back surface of the substrate 102, i.e., the front surface facing the suction surface 312 of the substrate 102 for suction by the chuck 101. In this case, the light for illuminating the alignment mark 103 via the optical system 100 does not need to transmit the substrate 102 such as silicon, and thus does not necessarily have the infrared wavelength.

Apparatuses to which the chuck 101 is provided are not limited to exposure apparatuses. The chuck 101 can also be applied to lithography apparatuses including drawing apparatuses and imprint apparatuses. The drawing apparatus is a lithography apparatus for drawing a pattern on a substrate by using a charged particle beam (e.g., an electron beam and an ion beam). The imprint apparatus is a lithography apparatus for molding an imprint material such as resin on a substrate to form a pattern on the substrate. The substrate is not limited to Si wafer and may be made of, for example, silicon carbide (SiC), sapphire, dopant Si, and glass.

<Article Manufacturing Method>

Next, a method for manufacturing articles (e.g., semiconductor IC elements and liquid crystal display elements) by using the above-described lithography apparatus, will be described. A lithography apparatus including the optical system 100 according to each exemplary embodiment is used.

In the article manufacturing method, a positioning process of, as a first process, positioning the substrate 102 is performed by detecting the alignment mark 103 formed on the held substrate 102, from the holding surface side of the substrate 102. Subsequently, a pattern forming process for forming a pattern is performed on the positioned substrate 102, and a development and etching process is performed on the substrate 102 with the pattern formed thereon.

The present article manufacturing method is more advantageous than conventional methods in at least one of the performance, quality, productivity, and production cost of articles. The above-described lithography apparatus can economically offer such articles as high-quality devices (including semiconductor integrated circuit elements and liquid crystal display elements) with a high throughput.

While the present invention has specifically been described based on the above-described exemplary embodiments, the present invention is not limited thereto and can be modified in diverse ways within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-041198, filed Mar. 7, 2018, which is hereby incorporated by reference herein in its entirety.

What is claimed is:

1. A pattern forming apparatus for forming a pattern on a substrate, the pattern forming apparatus comprising:
   a holding unit configured to hold the substrate; and
   an optical system configured to detect an alignment mark formed on the substrate when held by the holding unit, from a holding surface side of the substrate,
   wherein the optical system includes a separation element for separating pattern forming light for forming a pattern on the substrate and alignment mark detection light for detecting the alignment mark and reducing a light quantity of the pattern forming light incident to the optical system.

2. The pattern forming apparatus according to claim 1, wherein the separation element is a wavelength separation element for performing wavelength separation between the pattern forming light and the alignment mark detection light.

3. The pattern forming apparatus according to claim 2, wherein the wavelength separation element absorbs or reflects the pattern forming light and transmits the alignment mark detection light.

4. The pattern forming apparatus according to claim 3, wherein the wavelength separation element is a wavelength separation film provided on a lens that transmits the alignment mark detection light.

5. The pattern forming apparatus according to claim 4, wherein the lens provided with the wavelength separation film is made of a material having a refractive index of 1.80 or more to light with a wavelength of 400 nm.

6. The pattern forming apparatus according to claim 3, wherein the wavelength separation element is a wavelength separation film provided on a prism for reflecting the alignment mark detection light and transmitting the pattern forming light.

7. The pattern forming apparatus according to claim 6, wherein the prism provided with the wavelength separation film is made of a material having a refractive index of 1.80 or more to light with a wavelength of 400 nm.

8. The pattern forming apparatus according to claim 3, wherein the wavelength separation element is a wavelength separation filter.

9. The pattern forming apparatus according to claim 2, wherein the wavelength separation element is a dichroic prism that transmits the pattern forming light and reflects the alignment mark detection light.

10. The pattern forming apparatus according to claim 2, wherein the wavelength separation element is a dichroic prism that transmits the pattern forming light that has transmitted the substrate and reflects the alignment mark detection light.

11. The pattern forming apparatus according to claim 1, wherein the pattern forming light is ultraviolet light.

12. The pattern forming apparatus according to claim 11, wherein the ultraviolet light is near-ultraviolet light with a wavelength range of 100 to 400 nm.

13. The pattern forming apparatus according to claim 1, wherein the alignment mark detection light is near-infrared light with a wavelength range of 800 to 1500 nm.

14. The pattern forming apparatus according to claim 1, further comprising a detection unit configured to detect the alignment mark, wherein the detection unit detects an image of the alignment mark formed on an image plane via the optical system to acquire a position of the alignment mark.

15. The pattern forming apparatus according to claim 14, wherein a detection field of the detection unit overlaps with an irradiated region of the pattern forming light.

16. The pattern forming apparatus according to claim 1, wherein a position of the optical system with respect to the holding unit is fixed.

17. The pattern forming apparatus according to claim 16, wherein the optical system is a relay optical system fixedly disposed in the holding unit.

18. The pattern forming apparatus according to claim 1, further comprising a movable stage, wherein the holding unit is attachable to and detachable from the stage.

19. The pattern forming apparatus according to claim 1, wherein the separation element reduces a light quantity of the pattern forming light incident to an optical element of the optical system.

20. The pattern forming apparatus according to claim 1, wherein the separation element is arranged along a plane perpendicular to a light axis of the optical system.

21. The pattern forming apparatus according to claim 1, wherein the separation element is arranged at a position closer to a light source of the alignment mark detection light than an optical element of the optical system.

22. A substrate holding apparatus configured to hold a substrate, the holding apparatus comprising an optical system configured to detect an alignment mark formed on the substrate from a holding surface side of the substrate,
   wherein the optical system includes a separation element for separating pattern forming light for forming a pattern on the substrate and alignment mark detection light for detecting the alignment mark and reducing a light quantity of the pattern forming light incident to the optical system.

23. An article manufacturing method, comprising:
positioning a held substrate by detecting, from a holding surface side of the substrate, an alignment mark formed on the held substrate using alignment mark detection light;
forming a pattern on the positioned substrate using pattern forming light; and
manufacturing an article by processing the substrate with the pattern formed thereon,
wherein, in the positioning, the alignment mark is detected after separation of the pattern forming light using a separation element by using alignment mark detection light that has passed through a separation element for separating pattern forming light for forming a pattern on the substrate and alignment mark detection light for detecting the alignment mark and reducing a light quantity of the pattern forming light incident to the optical system.

* * * * *